United States Patent
Figuerado (10) Patent No.: US 7,580,260 B2
(45) Date of Patent: Aug. 25, 2009

(54) COUPLING FOR A FAN BAY INCLUDING FANS WITH A CHASSIS

(75) Inventor: Stephen Figuerado, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 323 days.

(21) Appl. No.: 11/470,690

(22) Filed: Sep. 7, 2006

(65) Prior Publication Data

US 2008/0062642 A1    Mar. 13, 2008

(51) Int. Cl.
H05K 7/20 (2006.01)
(52) U.S. Cl. ............... 361/695; 361/679.57; 415/213.1; 415/126; 454/184
(58) Field of Classification Search .................. 361/622, 361/687, 695, 719–721, 724–727, 752, 754, 361/796, 679.46–679.61; 454/184; 415/126, 415/213.1; 439/372
See application file for complete search history.

(56) References Cited

U.S. PATENT DOCUMENTS

| | | | |
|---|---|---|---|
| 6,244,953 B1 * | 6/2001 | Dugan et al. ................. | 454/184 |
| 6,373,698 B1 * | 4/2002 | Christensen ................. | 361/695 |
| 6,556,437 B1 * | 4/2003 | Hardin ......................... | 361/687 |
| 6,603,661 B2 * | 8/2003 | Smith et al. .................. | 361/695 |
| 6,711,013 B2 | 3/2004 | Wobig et al. | |
| 6,839,233 B2 | 1/2005 | Gravens et al. | |
| 6,851,925 B2 * | 2/2005 | Chuang ....................... | 415/126 |
| 7,397,660 B2 * | 7/2008 | Strmiska et al. ............. | 361/687 |
| 2002/0086574 A1 | 7/2002 | Vinson et al. | |
| 2002/0094772 A1 * | 7/2002 | Gough ......................... | 454/184 |
| 2003/0123222 A1 | 7/2003 | Thompson et al. | |
| 2004/0075983 A1 | 4/2004 | Thompson et al. | |
| 2005/0254210 A1 | 11/2005 | Grady et al. | |
| 2007/0035923 A1 * | 2/2007 | Beall et al. .................. | 361/687 |
| 2008/0182501 A1 * | 7/2008 | Yang .......................... | 454/184 |

* cited by examiner

*Primary Examiner*—Jayprakash N Gandhi
*Assistant Examiner*—Courtney Smith
(74) *Attorney, Agent, or Firm*—Haynes and Boone, LLP (57) ABSTRACT

A fan bay and fan coupling apparatus include a chassis including a plurality of fan bay locating features and a plurality of fan connectors. A fan bay includes a plurality of chassis locating features and defines a plurality of fan assembly housings, wherein the chassis locating features on the fan bay are engageable with the fan bay locating features on the chassis. A plurality of fan assemblies each include a fan, wherein a fan assembly is located in each of the fan assembly housings, whereby the engagement of the chassis locating features on the fan bay with the fan bay locating features on the chassis allows the alignment and coupling of the plurality of fan assemblies with respective fan connectors on the chassis.

13 Claims, 11 Drawing Sheets

COUPLING FOR A FAN BAY INCLUDING FANS WITH A CHASSIS

BACKGROUND

The present disclosure relates generally to information handling systems, and more particularly to a coupling for a fan bay including fans with a information handling system chassis.

As the value and use of information continues to increase, individuals and businesses seek additional ways to process and store information. One option is an information handling system (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

IHSs typically include fan assemblies that are coupled to an IHS chassis in order to provide cooling for the heat producing components located in the IHS chassis. As IHSs grow and the heat producing components become greater in number and power, more and more fan assemblies are required to keep those heat producing components cool. The coupling of these multiple fan assemblies to the IHS chassis raises a number of issues.

Typically, a fan bay is provided that defines multiple fan assembly housings, each which can house a fan assembly. That fan bay is coupled to the IHS chassis and adjacent the IHS board in order to allow multiple fan assemblies to be coupled to the fan bay, the board, and the chassis. However, conventional chassis component tolerance stacks exceed the gathering limits between the board, the cooling fan connectors, the fan assembly, and fan bay. This results in the need to couple the fan bay to the chassis first, then couple each fan assembly to the fan bay in order to ensure the connector on the fan assembly correctly mates with the fan connector on the board. Some IHSs can include fan bays that house six or more cooling fans, so such a process greatly adds to the assembly time of the IHS.

Accordingly, it would be desirable to provide a coupling for a fan bay including fans with a chassis absent the disadvantages found in the prior methods discussed above.

SUMMARY

According to one embodiment, a fan bay and fan coupling apparatus include a chassis including a plurality of fan bay locating features and a plurality of fan connectors, a fan bay including a plurality of chassis locating features and defining a plurality of fan assembly housings, wherein the chassis locating features on the fan bay are engageable with the fan bay locating features on the chassis, and a plurality of fan assemblies each including a fan, wherein a fan assembly is located in each of the fan assembly housings, whereby the engagement of the chassis locating features on the fan bay with the fan bay locating features on the chassis allows the coupling of the plurality of fan assemblies with respective fan connectors on the chassis.

BRIEF DESCRIPTION OF THE DRAWINGS

FIG. 2b is a rear perspective view illustrating an embodiment of the board of FIG. 2a.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
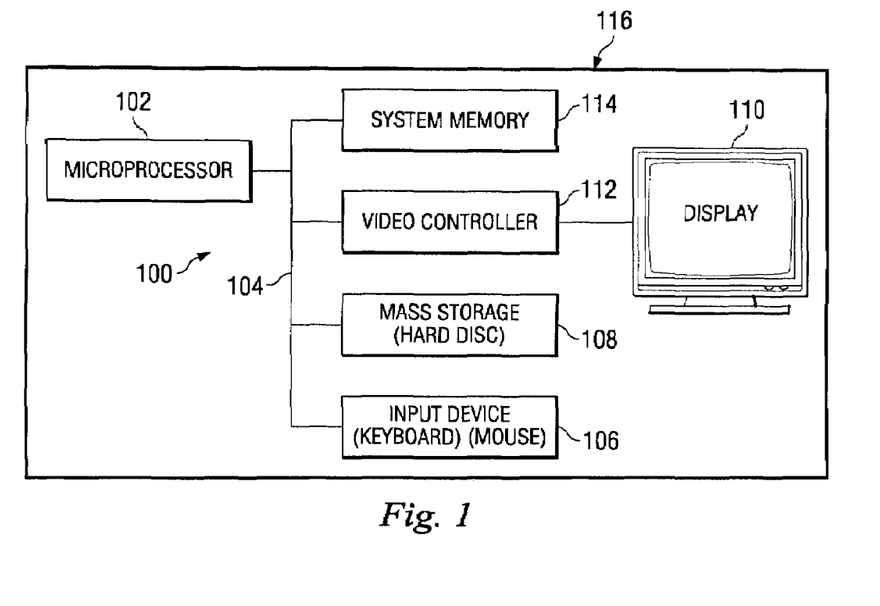
FIG. 1 is a schematic view illustrating an embodiment of an IHS.

In one embodiment, IHS 100, FIG. 1, includes a processor 102, which is connected to a bus 104. Bus 104 serves as a connection between processor 102 and other components of computer system 100. An input device 106 is coupled to processor 102 to provide input to processor 102. Examples of input devices include keyboards, touchscreens, and pointing devices such as mouses, trackballs and trackpads. Programs and data are stored on a mass storage device 108, which is coupled to processor 102. Mass storage devices include such devices as hard disks, optical disks, magneto-optical drives, floppy drives and the like. IHS 100 further includes a display 110, which is coupled to processor 102 by a video controller 112. A system memory 114 is coupled to processor 102 to provide the processor with fast storage to facilitate execution of computer programs by processor 102. In an embodiment, a chassis 116 houses some or all of the components of IHS 100. It should be understood that other buses and intermediate circuits can be deployed between the components described above and processor 102 to facilitate interconnection between the components and the processor 102.

Figure 2A:
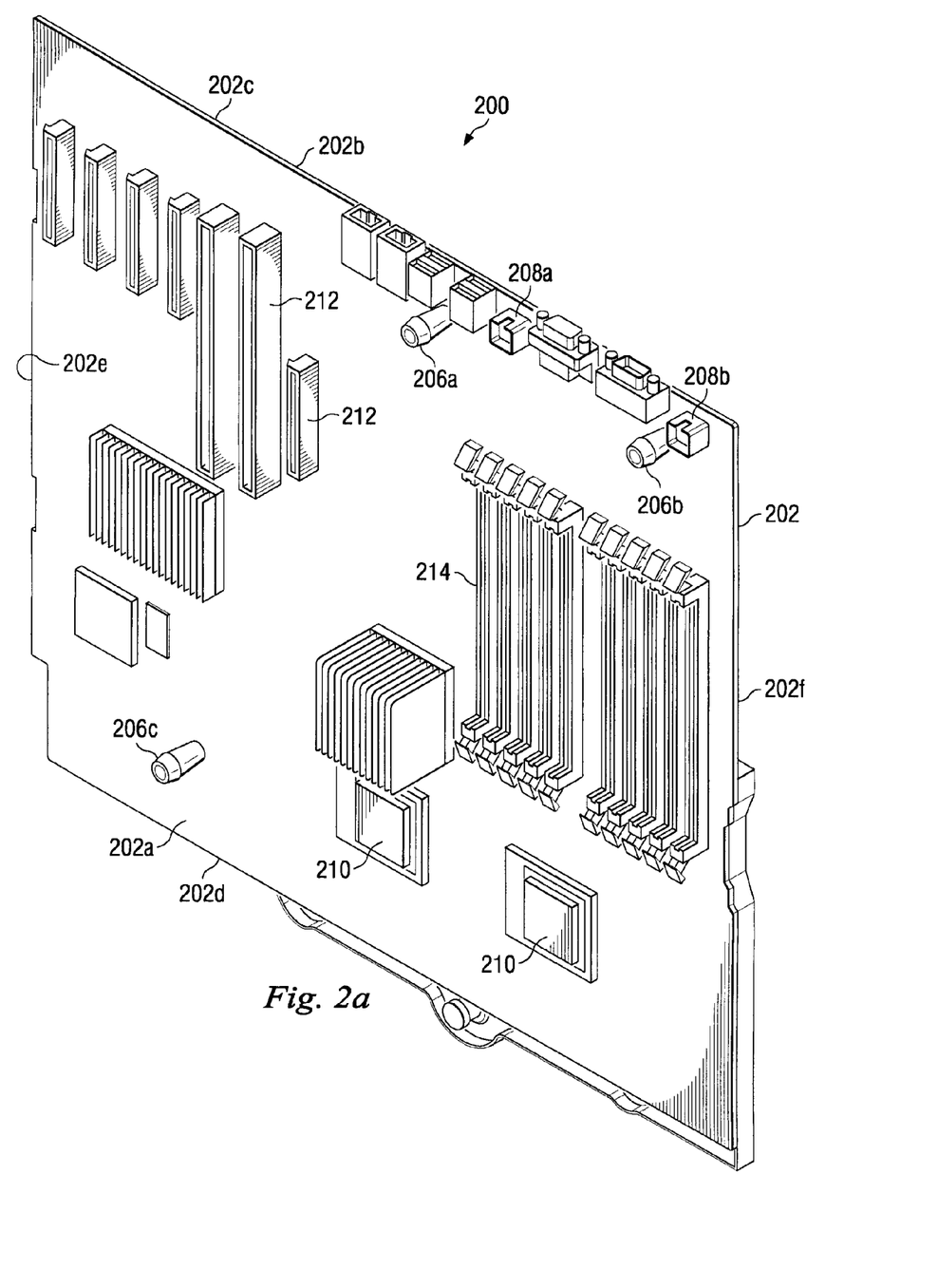
FIG. 2a is a front perspective view illustrating an embodiment of a board.
Figure 2B:
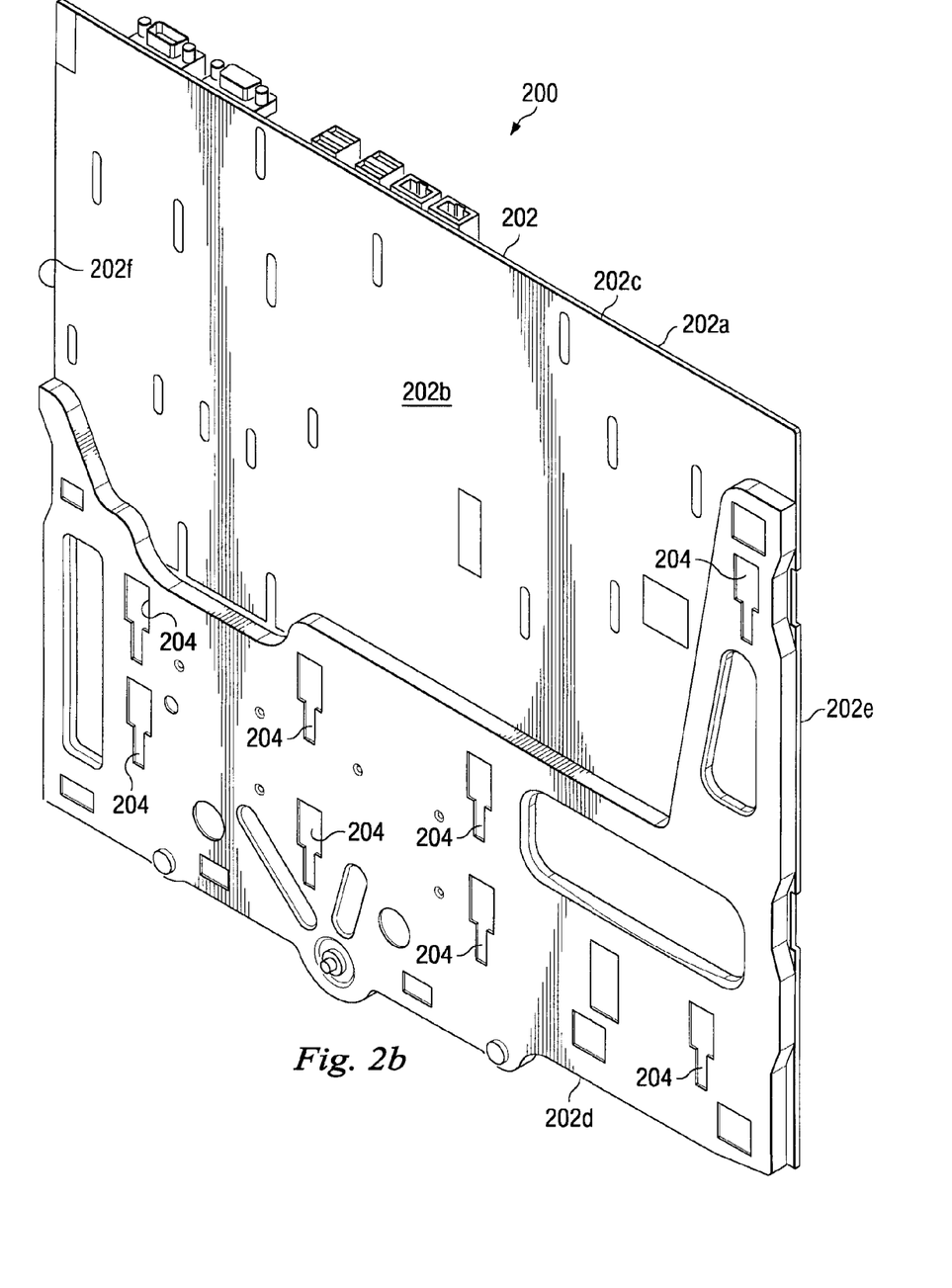

Referring now to FIGS. 2a and 2b, a board 200 is illustrated. The board 200 includes a base 202 having a front surface 202a, a rear surface 202b located opposite the front surface 202a, a top edge 202c extending between the front surface 202a and the rear surface 202b, a bottom edge 202d located opposite the top edge 202c and extending between the front surface 202a and the rear surface 202b, and a pair of opposing side edges 202e and 202f extending between the front surface 202a, the rear surface 202b, the top edge 202c, and the bottom edge 202d. A plurality of chassis coupling apertures 204 are defined by the base 202 and located on the rear surface 202b of the base 202 in a spaced apart orientation from each other. A plurality of fan bay locating features are included on the board 200 and, in an embodiment, include a plurality of fan bay locating posts 206a, 206b, and 206c extending from the front surface 202a of the board 200 in a spaced apart orientation from each other with the fan bay locating posts 206a and 206b located adjacent the top edge 202c of the board 200 and the fan bay locating post 206c located adjacent the bottom edge 202d of the board 200. In an embodiment, the fan bay locating posts 206a, 206b and 206c are only mechanically coupled to the board 200. A plurality of fan connectors 208a and 208b extend from the front surface 202a of the board 200 adjacent the fan bay locating posts 206a and 206b, respectively. In an embodiment, the board 200 may include some of the components of the IHS 100, described above with reference to FIG. 1, such as, for example, processors 210, which may be the processor 102 described above with reference to FIG. 1 and may be electrically coupled to the fan connectors 208a and 208b, card connectors 212, memory connectors 214, and/or a variety of other IHS components known in the art.

Figure 3:
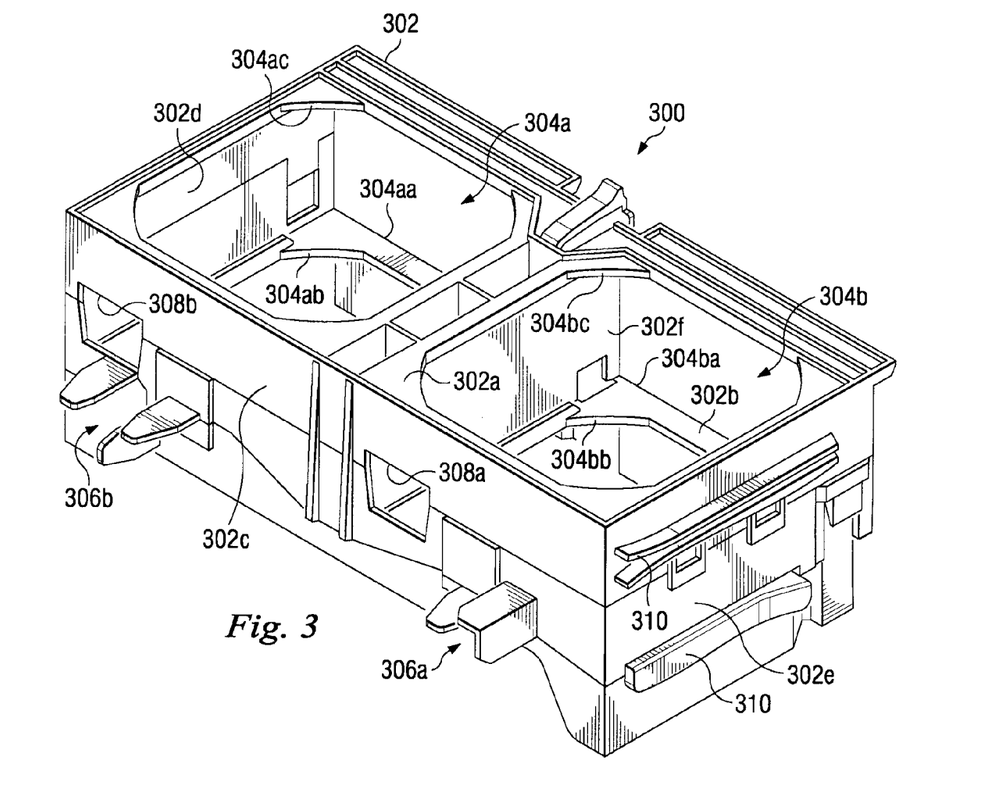
FIG. 3 is a perspective view illustrating an embodiment of a fan bay used with the board of FIGS. 2a and 2b.

Referring now to FIG. 3, a fan bay 300 is illustrated. The fan bay 300 includes a base 302 having a front wall 302a, a rear wall 302b located opposite the front wall 302a, a bottom wall 302c extending between the front wall 302a and the rear wall 302b, a pair of opposing side walls 302d and 302e extending between the front wall 302a, the rear wall 302b, and the bottom wall 302c, and a dividing wall 302f extending between the front wall 302a, the rear wall 302b, and the bottom wall 302c and located on the base approximately midway between the sides walls 302d and 302e. A fan assembly housing 304a is defined between the front wall 302a, the rear wall 302b, the bottom wall 302c, the side wall 302d, and the dividing wall 302f and includes a fan assembly entrance 304aa and a pair of air passageways 304ab and 304ac defined by the front wall 302a and the rear wall 302b, respectively. A fan assembly housing 304b is defined between the front wall 302a, the rear wall 302b, the bottom wall 302c, the side wall 302e, and the dividing wall 302f and includes a fan assembly entrance 304ba and a pair of air passageways 304bb and 304bc defined by the front wall 302a and the rear wall 302b, respectively. A pair of chassis locating features are included on the base 300 and, in an embodiment, include a pair of post housings 306a and 306b defined by the base 300 and located in a spaced apart orientation on the bottom wall 302c of the base 300. The bottom wall 302c defines a pair of fan assembly plug apertures 308a and 308b that extend through the bottom wall 302c to the fan assembly housings 304b and 304a, respectively, and are located adjacent the post housings 306a and 306b, respectively. A chassis coupling feature includes a pair of guides 310 that extend from the side wall 302e and may also include guides (not shown) that extend from the side wall 302d. While the fan bay 300, as illustrated, is operable to house only two fan assemblies, in an embodiment, the fan bay 300 may house any plurality of fan assemblies.

Figure 4:
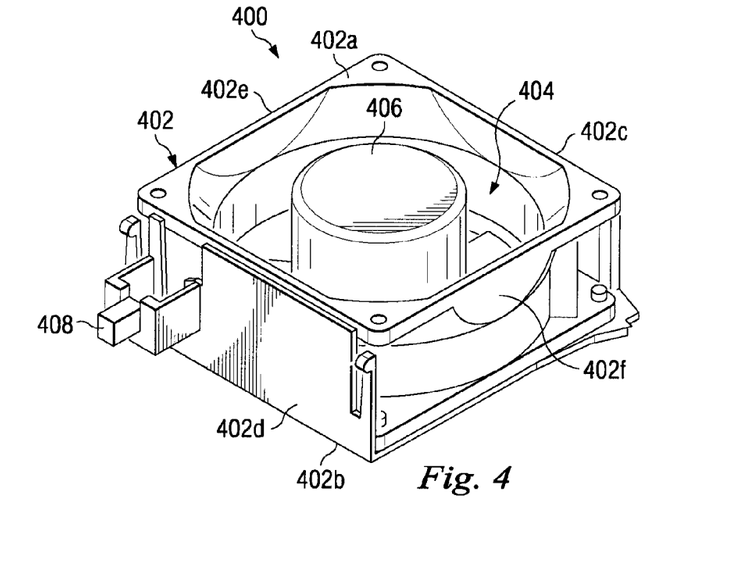
FIG. 4 is a perspective view illustrating an embodiment of a fan assembly used with the board of FIGS. 2a and 2b and the fan bay of FIG. 3.

Referring now to FIG. 4, a fan assembly 400 is illustrated. In an embodiment, the fan assembly 400 is a hot plug fan known in the art. The fan assembly 400 includes a base 402 having a front surface 402a, a rear surface 402b located opposite the front surface 202a, a top surface 402c extending between the front surface 402a and the rear surface 402b, a bottom surface 402d located opposite the top surface 402c and extending between the front surface 402a and the rear surface 402b, and a pair of opposing side surfaces 402e and 402f extending between the front surface 402a, the rear surface 402b, the top surface 402c, and the bottom surface 402d. A fan housing 404 is defined by the base 402 and located between the front surface 402a, the rear surface 402b, the top surface 402c, the bottom surface 402d, and the side surfaces 402e and 402f. A fan 406 is located in the fan housing 404. A fan plug 408 extends from the bottom surface 402d of the base 402.

Figure 5:
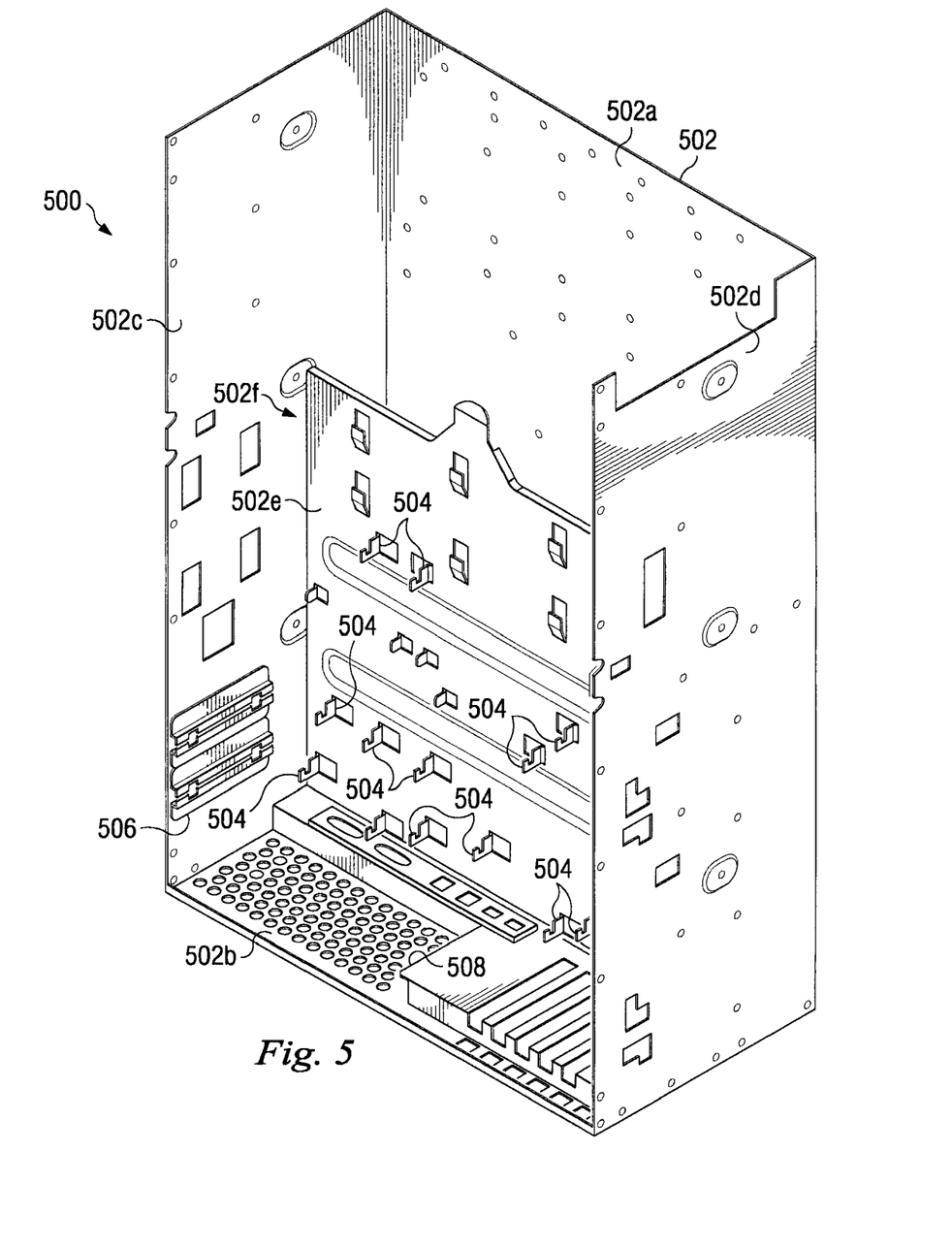
FIG. 5 is a perspective view illustrating an embodiment of a chassis used with the board of FIGS. 2a and 2b, the fan bay of FIG. 3, and the fan assembly of FIG. 4.

Referring now to FIG. 5, a chassis 500 is illustrated. In an embodiment, the chassis 500 may be the chassis 116, described above with reference to FIG. 1, and may house some or all of the components of the IHS 100, described above with reference to FIG. 1. The chassis 500 includes a base 502 having a bottom wall 502a, a rear wall 502b extending from the bottom wall 502a, a pair of opposing side walls 502c and 502d extending between the bottom wall 502a and the rear wall 502b, and an internal wall 502e extending between the rear wall 502b and the side walls 502c and 502d. An IHS housing 502f is defined by the chassis 500 between the rear wall 502b, the side walls 502c and 502d, and the internal wall 502e. A plurality of board coupling members 504 extend from the internal wall 502e and into the IHS housing 502f. A fan bay coupling member 506 extends from the side wall 502c and into the IHS housing 502f. A fan bay coupling edge 508 is located on the rear wall 502b in a spaced apart relationship to the fan bay coupling member 506.

Figure 6A:
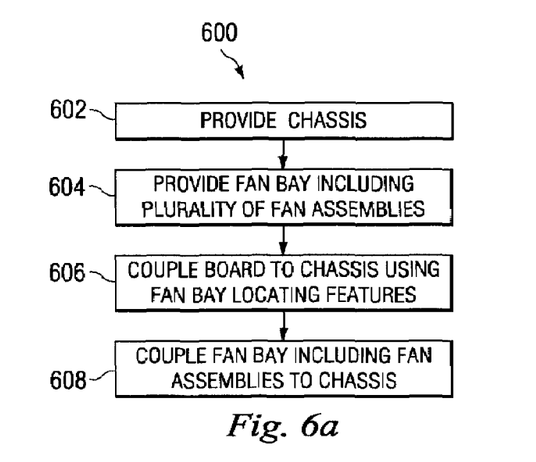
FIG. 6a is a flow chart illustrating an embodiment of a method for coupling a fan bay including fans to a chassis.
Figure 6B:
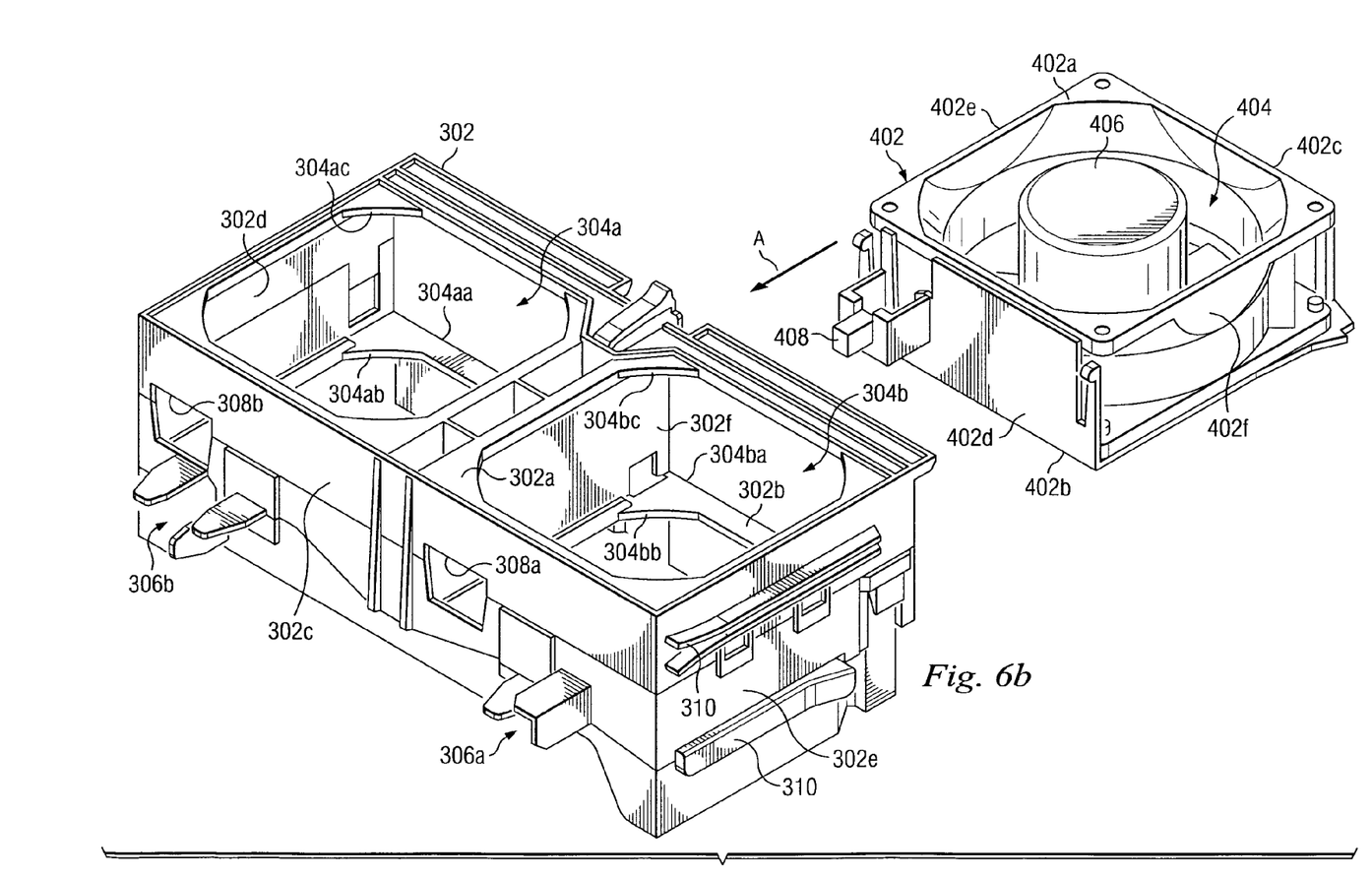
FIG. 6b is a perspective view illustrating an embodiment of the fan assembly of FIG. 4 being coupled to the fan bay of FIG. 3.
Figure 6C:
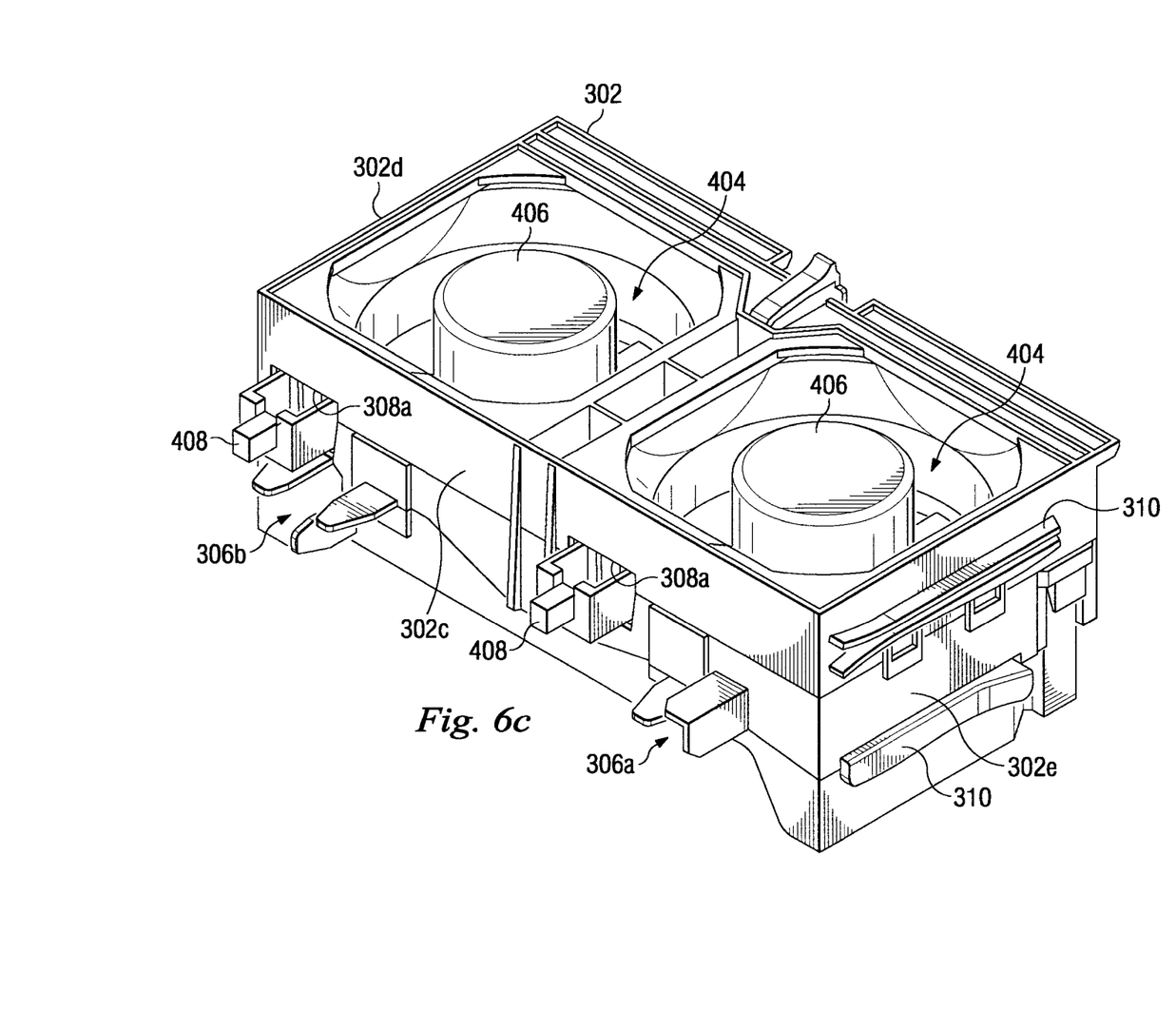
FIG. 6c is a perspective view illustrating an embodiment of a plurality of the fan assemblies of FIG. 4 coupled to the fan bay of FIG. 3.

Referring now to FIGS. 3, 4, 5, 6a, 6b and 6c, a method 600 for coupling a fan bay including fans to a chassis is illustrated. The method 600 begins at step 602 where the chassis 500, illustrated in FIG. 5, is provided. The method 600 then proceeds to step 604 where the fan bay 300 including a plurality of the fan assemblies 400 is provided. A fan assembly 400 is positioned adjacent the fan bay 300 such that the bottom surface 402d of the fan assembly is located adjacent the fan assembly housing 304b with the side surfaces 402e and 402f located adjacent the dividing wall 302f and the side wall 302e, respectively, and the fan plug 408 aligned with the fan assembly plug aperture 308a, as illustrated in FIG. 6b. The fan assembly 400 is then moved in a direction A such that the fan assembly 400 enters the fan assembly housing 304b and couples to the fan bay 300 with the fan plug 408 extending through fan assembly plug aperture 308a and out past the bottom wall 302c of the fan bay 300, as illustrated in FIG. 6c. A fan assembly 400 may be positioned in the fan assembly housing 304a and coupled to the fan bay 300 in the same manner as described above for the fan assembly 400 in the fan assembly housing 304b, as illustrated in FIG. 6c. In an embodiment, the fan bay may include more fan assembly housings, and more fan assemblies may be coupled to the fan bay as described above.

Figure 6D:
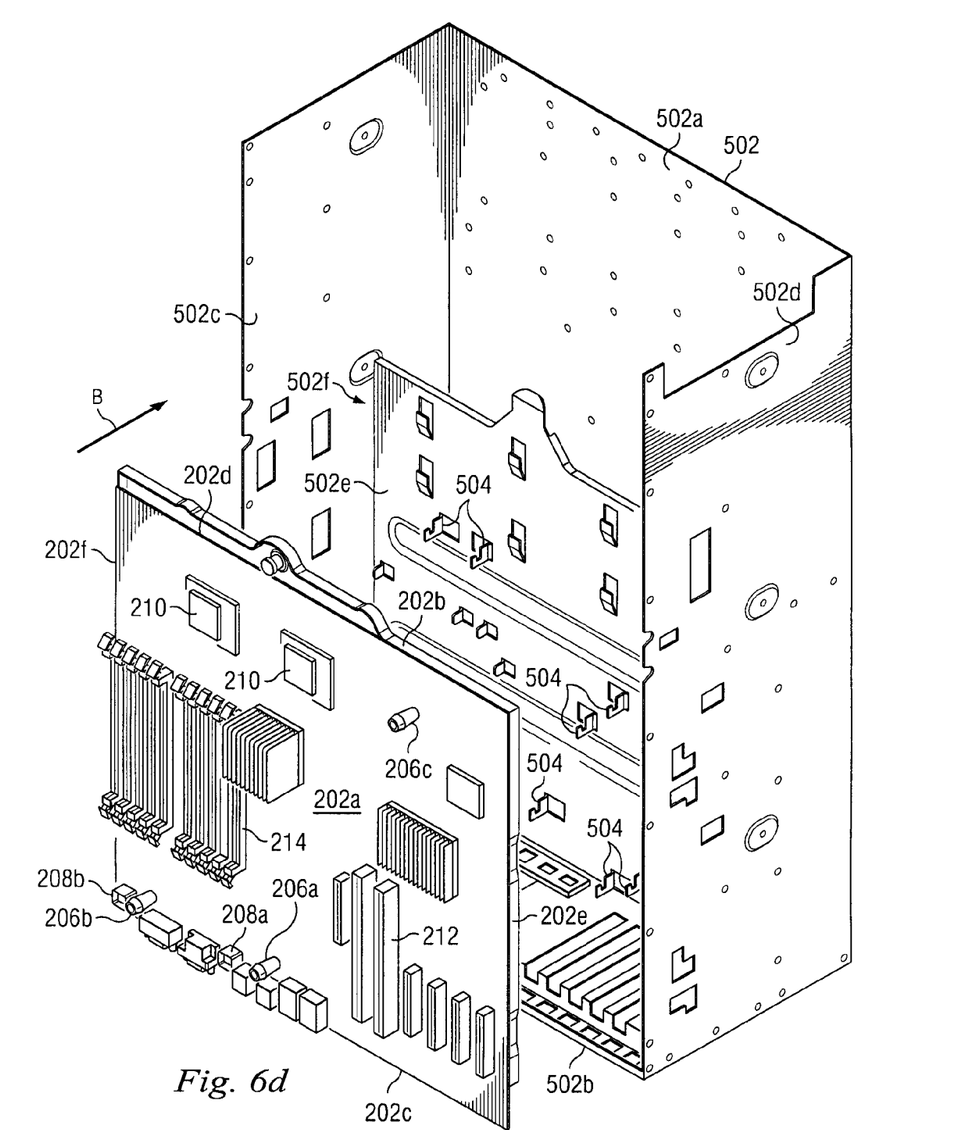
FIG. 6d is a perspective view illustrating an embodiment of the board of FIG. 2 being coupled to the chassis of FIG. 5.
Figure 6E:
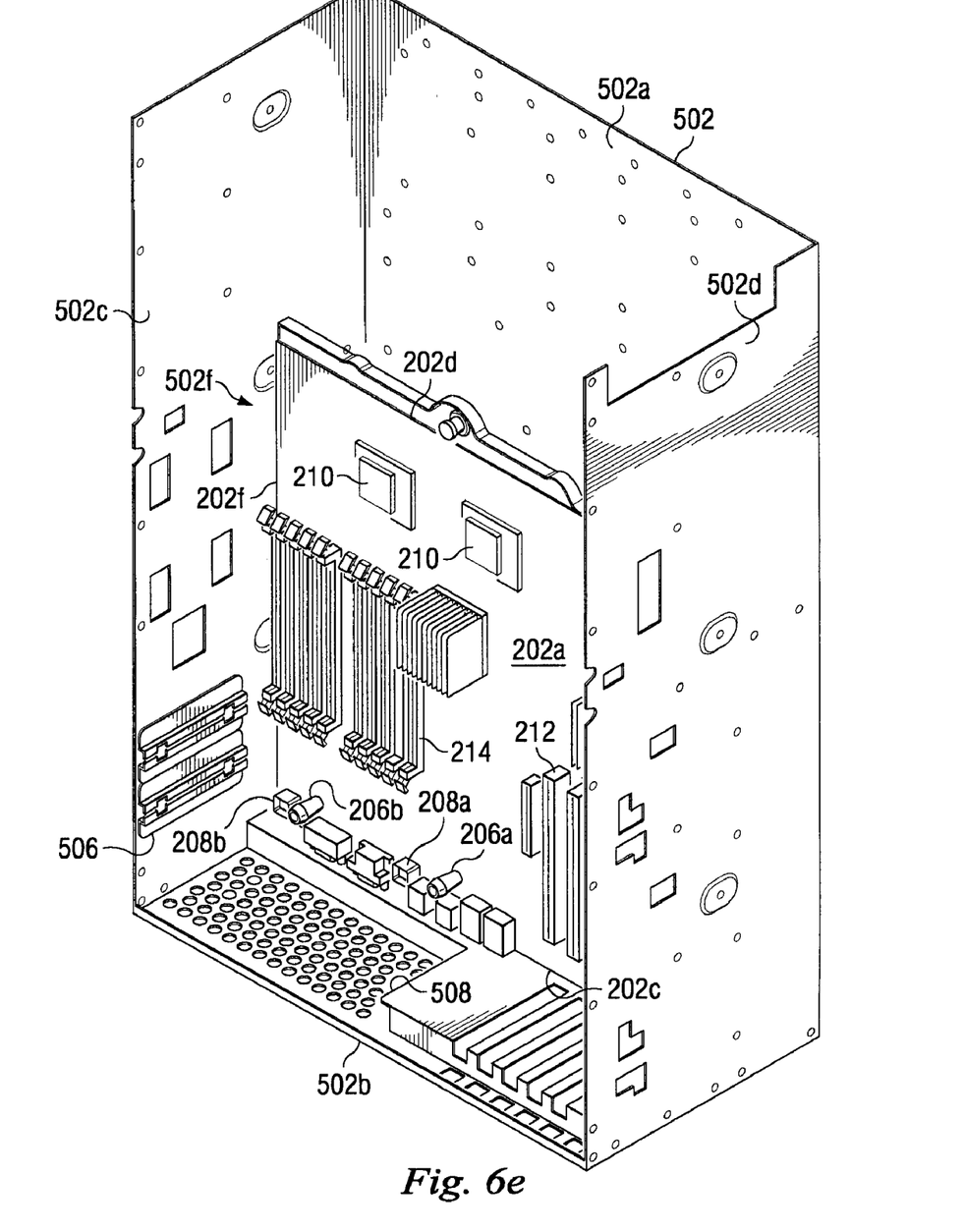
FIG. 6e is a perspective view illustrating an embodiment of the board of FIG. 2 coupled to the chassis of FIG. 5.

Referring now to FIGS. 2a, 2b, 5, 6a, 6d and 6e, the method 600 then proceeds to step 606 where the board 200 is coupled to the chassis 500 using the fan bay locating features. In an embodiment, the fan bay locating features include the fan bay locating posts 206a, 206b and/or 206c which are only mechanically coupled to the board 200 and may be grasped by a user. Because the fan bay locating posts 206a, 206b and 206c are only mechanically coupled to the board 200, they may be grasped by the user without damaging electrical components on the board 200 that can occur when a component on the board 200 is grasped in order to position and move the board 200. Using the fan bay locating posts 206a, 206b and/or 206c, the board 200 is positioned adjacent the chassis 500 such that the bottom surface 202b is located adjacent the IHS housing 502f with the side edges 202e and 202f located adjacent the side walls 502d and 502c, respectively, the top edge 202c located adjacent the rear wall 502b, and the chassis coupling apertures 204 defined by the board 200 aligned with the board coupling members 504 extending from the internal wall 502e of the chassis 500, as illustrated in FIG. 6d. The board 200 is then moved in a direction B and coupled to the chassis by engaging the board coupling members 504 with the chassis coupling apertures 204, as illustrated in FIG. 6e.

Figure 6F:
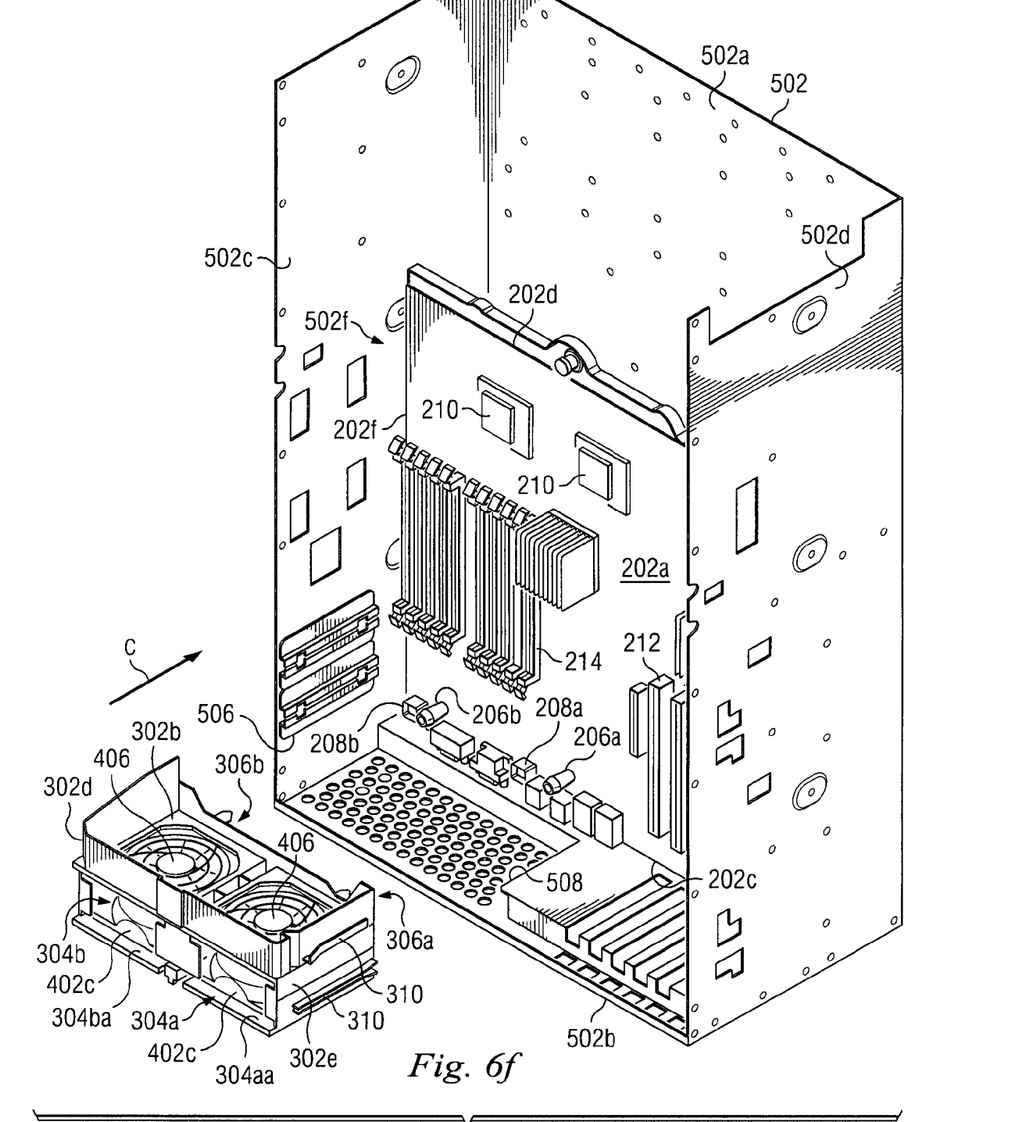
FIG. 6f is a perspective view illustrating an embodiment of the fan bay and fan assemblies of FIG. 6c being coupled to the chassis and board of FIG. 6d.
Figure 6G:
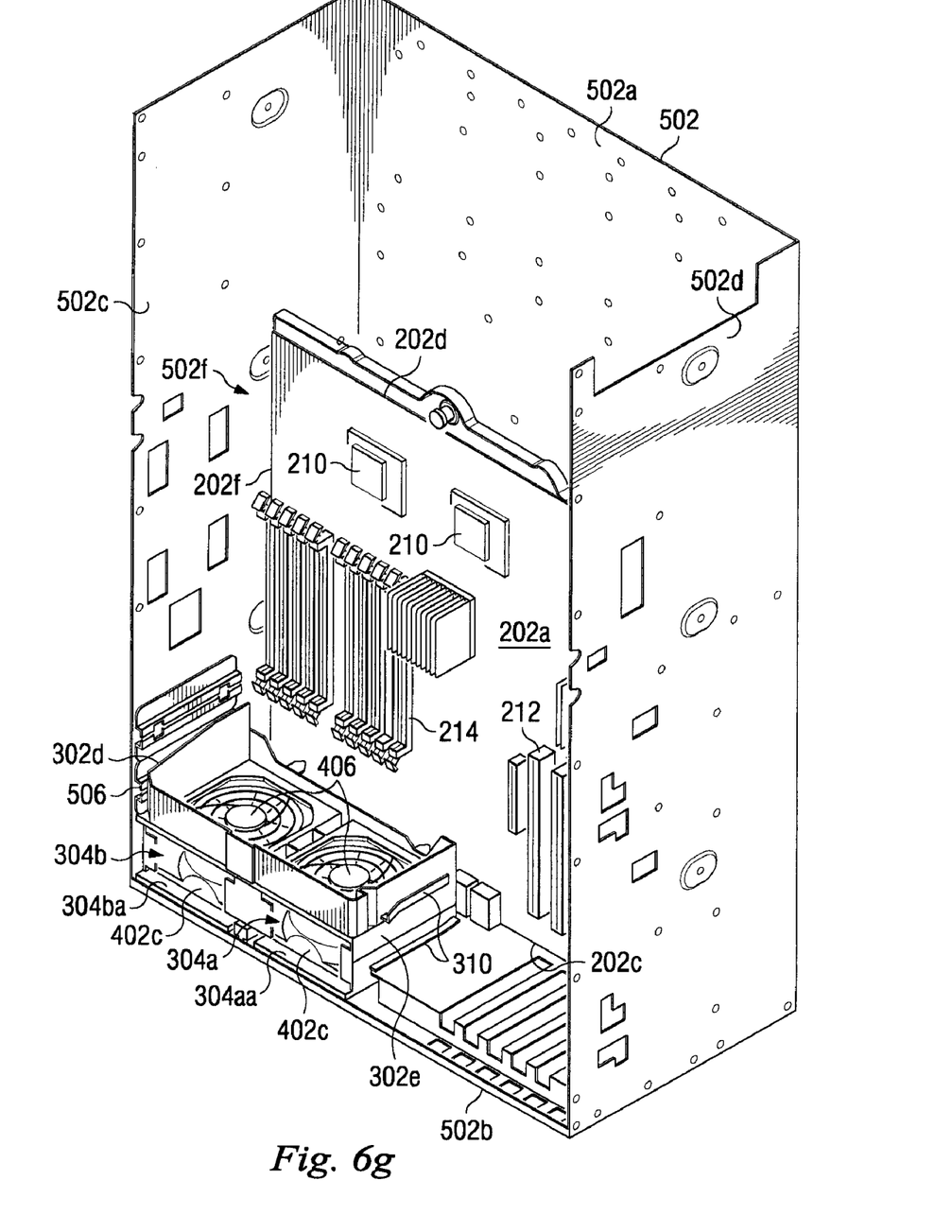
FIG. 6g is a perspective view illustrating an embodiment of the fan bay and fan assemblies of FIG. 6c coupled to the chassis and board of FIG. 6d.

Referring now to FIGS. 2a, 2b, 3, 4, 5, 6a, 6f and 6g, the method 600 then proceeds to step 608 where the fan bay 300 including the fan assemblies 300 is coupled to the chassis 500. The fan bay 300 including the fan assemblies 300, illustrated in FIG. 6c, are positioned adjacent the chassis 500 and board 400, illustrated in FIG. 6e, such that the rear wall 302b of the fan bay 300 is located adjacent the rear wall 502b of the chassis 500, with the side wall 302d adjacent the side wall 502c, the fan plugs 408 aligned with the fan connectors 208a and 208b, and the fan bay locating posts 206a and 206b aligned with the post housings 306a and 306b, respectively, as illustrated in FIG. 6f. The fan bay 300 is then moved in an direction C such that the fan bay coupling edge 508 on the rear wall 502b of the chassis 500 engages the guide 310 on the fan bay 300 and the fan bay coupling member 506 engages the side wall 302d of the fan bay 300. Continued movement of the fan bay 300 in the direction C results in the engagement of the fan bay locating posts 206a and 206b with the post housings 306a and 306b, respectively, which aligns the fan plugs 408 with the fan connectors 208a and 208b in order to ensure the proper electrical coupling of them upon engagement. Further movement of the fan bay 300 in the direction C results in the engagement of the fan plugs 408 with the fan connectors 208a and 208b such that they are electrically and physically coupled together, as illustrated in FIG. 6g. Thus, a method and apparatus are provided which allow a plurality of fan assemblies to be coupled to and decoupled from a chassis simultaneously while ensuring the proper electrical and physical connection between all of the fan assemblies and fan connectors in the chassis.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A fan bay and fan coupling apparatus, comprising:

a chassis comprising a plurality of fan bay locating features and a plurality of fan connectors;

a fan bay comprising a plurality of chassis locating features and defining a plurality of fan assembly housings, wherein the chassis locating features on the fan bay are engageable with the fan bay locating features on the chassis;

a plurality of fan assemblies each comprising a fan, wherein a fan assembly is located in each of the fan assembly housings, whereby the engagement of the chassis locating features on the fan bay with the fan bay locating features provides alignment and coupling of the plurality of fan assemblies with respective fan connectors; and a board including a processor mounted in the chassis, wherein the fan bay locating features and the fan connectors are located on the board, and wherein the fan bay locating features extend from the board, and are only mechanically coupled to the board.

2. The apparatus of claim 1, wherein the plurality of fan bay locating features comprise a plurality of posts extending from the board and the plurality of chassis locating features comprise a plurality of post housings defined by the fan bay.

3. The apparatus of claim 1, wherein the fan bay locating features are located adjacent respective fan connectors.

4. The apparatus of claim 1, wherein the fan bay comprises a chassis coupling feature.

5. The apparatus of claim 1, wherein the fan bay defines a plurality of fan assembly plug apertures.

6. The apparatus of claim 5, wherein the plurality of fan assembly plug apertures are located adjacent respective chassis locating features.

7. An information handling system (IHS), comprising:

an IHS chassis comprising a plurality of fan bay locating features and a plurality of fan connectors;

a board coupled to the chassis;

a processor mounted to the board;

a fan bay comprising a plurality of chassis locating features and defining a plurality of fan assembly housings, wherein the chassis locating features on the fan bay are engageable with the fan bay locating features on the chassis; and a plurality of fan assemblies each comprising a fan, wherein a fan assembly is located in each of the fan assembly housings, whereby the engagement of the chassis locating features on the fan bay with the fan bay locating features provides alignment and coupling of the plurality of fan assemblies with respective fan connectors, wherein the fan bay locating freatures and the fan connectors are located on the board, and the fan bay locating features extend from the board and are only mechanically coupled to the board.

8. The system of claim 7, wherein the plurality of fan bay locating features comprise a plurality of posts extending from the board and the plurality of chassis locating features comprise a plurality of post housings defined by the fan bay.

9. The system of claim 7, wherein the fan bay locating features are located adjacent respective fan connectors.

10. The system of claim 7, wherein the fan bay comprises a chassis coupling feature engageable with the chassis to couple the fan bay to the chassis.

11. The system of claim 7, wherein the fan bay defines a plurality of fan assembly plug apertures.

12. The system of claim 11, wherein the plurality of fan assembly plug apertures are located adjacent respective chassis locating features.

13. The system of claim 7, wherein the fan bay locating features are operable to move the board in order to couple the board to the chassis and decouple the board from the chassis.

* * * * *

UNITED STATES PATENT AND TRADEMARK OFFICE
CERTIFICATE OF CORRECTION

PATENT NO. : 7,580,260 B2  Page 1 of 1
APPLICATION NO. : 11/470690
DATED : August 25, 2009
INVENTOR(S) : Stephen Figuerado

It is certified that error appears in the above-identified patent and that said Letters Patent is hereby corrected as shown below:

Column 1, Line 8, delete "a" and insert --an--.

Claim 7, Column 6, Line 59, delete "freatures" and insert --feature--.

Signed and Sealed this

Nineteenth Day of January, 2010

David J. Kappos
*Director of the United States Patent and Trademark Office*